(12) United States Patent
Yeh et al.

(10) Patent No.: US 8,105,891 B2
(45) Date of Patent: *Jan. 31, 2012

(54) METHOD FOR TUNING A WORK FUNCTION OF HIGH-K METAL GATE DEVICES

(75) Inventors: Chiung-Han Yeh, Tainan (TW); Sheng-Chen Chung, Jhubei (TW); Kong-Beng Thei, Hsinchu (TW); Harry Chuang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.
This patent is subject to a terminal disclaimer.

(21) Appl. No.: 12/944,221

(22) Filed: Nov. 11, 2010

(65) Prior Publication Data

US 2011/0059601 A1 Mar. 10, 2011

Related U.S. Application Data

(63) Continuation of application No. 12/488,960, filed on Jun. 22, 2009, now Pat. No. 7,927,943.

(60) Provisional application No. 61/096,659, filed on Sep. 12, 2008.

(51) Int. Cl.
*H01L 21/8238* (2006.01)

(52) U.S. Cl. . 438/199; 438/283; 438/585; 257/E21.434; 257/E21.444

(58) Field of Classification Search .......... 438/142, 438/197, 199, 200, 216, 223, 231, 232, 275, 438/279, 283, 585; 257/251, 270, 350, 371, 257/357, E27.108, E21.632, E21.637, E21.434, E21.444, E21.453
See application file for complete search history.

(56) References Cited

U.S. PATENT DOCUMENTS

| 7,927,943 B2* | 4/2011 | Yeh et al. ............ 438/199 |
| 2006/0081939 A1* | 4/2006 | Akasaka et al. .......... 257/371 |
| 2007/0066077 A1* | 3/2007 | Akasaka et al. .......... 438/710 |
| 2008/0087966 A1* | 4/2008 | Tai et al. ................ 257/369 |
| 2009/0039433 A1 | 2/2009 | Yang et al. |
| 2009/0302412 A1* | 12/2009 | Cheng et al. .......... 257/506 |

FOREIGN PATENT DOCUMENTS

| CN | 1947242 | 4/2007 |
| JP | 2008193060 | 8/2008 |

OTHER PUBLICATIONS

Chinese Patent Office, Office Action dated Oct. 11, 2010, Application No. 200910169148.7, 5 pages.

* cited by examiner

*Primary Examiner* — Brook Kebede
(74) *Attorney, Agent, or Firm* — Haynes and Boone, LLP

(57) ABSTRACT

A method of fabricating a semiconductor device includes forming a first trench and a second trench on a semiconductor substrate and forming a first metal layer in the first and second trenches. The first metal layer is then removed, at least partially, from within the first trench but not the second trench. A second metal layer and a third metal layer are formed in the first and second trenches. A thermal process is used to reflow the second metal layer and the third metal layer.

20 Claims, 12 Drawing Sheets

METHOD FOR TUNING A WORK FUNCTION OF HIGH-K METAL GATE DEVICES

PRIORITY DATA

This application is a continuation of U.S. patent application Ser. No. 12/488,960, filed on Jun. 22, 2009, now U.S. Pat. No. 7,927,943, issued Apr. 19, 2011, which claims priority to U.S. Provisional Patent Application Ser. No. 61/096,659, filed on Sep. 12, 2008, the entire disclosures of which are incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, an n-type MOS device (NMOS) and a p-type MOS device (PMOS) require different work functions for their respective gate structures. One approach uses capping layers to tune an effective work function of the metal gates of the PMOS and NMOS devices. Although this approach has been satisfactory for its intended purpose, it has not been satisfactory in all respects. For example, the capping layers may decrease carrier mobility, and thus device performance may be adversely affected.

SUMMARY

The present disclosure describes new semiconductor methods and devices. In one embodiment, the present disclosure describes a method of fabricating a semiconductor device including forming a first trench and a second trench on a semiconductor substrate and forming a first metal layer in the first and second trenches. The first metal layer is then removed, at least partially, from within the first trench but not the second trench. A second metal layer and a third metal layer are formed in the first and second trenches. A thermal process is used to reflow the second metal layer and the third metal layer.

In another embodiment, the present disclosure describes a method of fabricating a semiconductor device including forming first and second trenches in a semiconductor substrate and forming a P-type work function metal (P-metal) to partially fill the first and second trenches. The P-metal is removed, at least partially, from within the first trench. Layers of Ti and Al are provided to fill the first and second trenches and are reflowed to form a layer of TiAl.

In yet another embodiment, the present disclosure describes a method of fabricating a semiconductor device including forming first and second trenches and forming a P-type work function metal (P-metal) to partially fill the first and second trenches. The P-metal is removed, at least partially, from within the first trench but not the second trench. Layers of Ti and Al are provided to the first and second trenches and reflowed to form a layer of TiAl. A chemical mechanical polishing (CMP) planarizes the TiAl layer, at least partially.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, the present disclosure provides examples of a "gate last" metal gate process, however one skilled in the art may recognize applicability to other processes and/or use of other materials.

Figure 1:
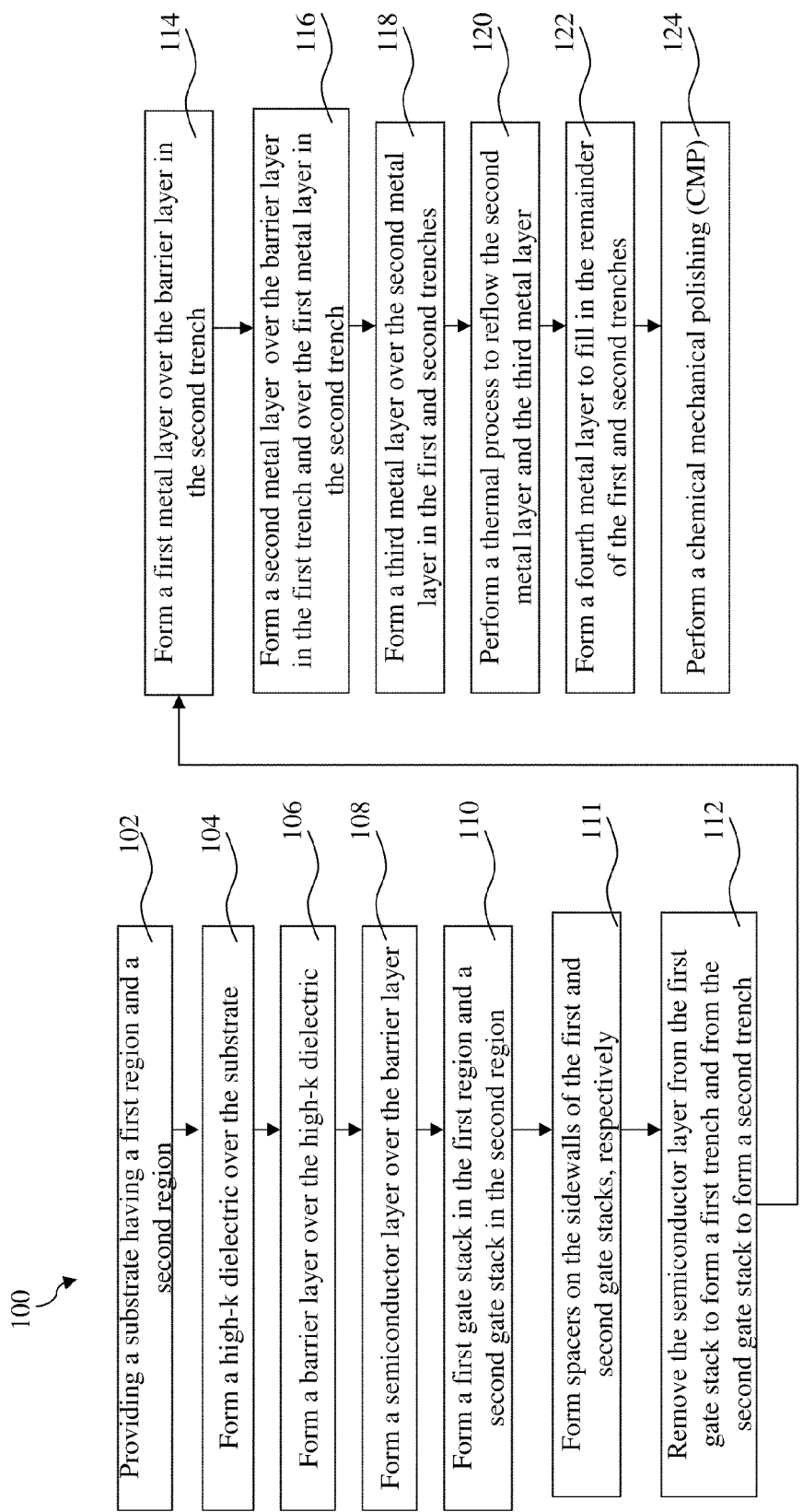
FIG. 1 is a flowchart illustrating a method for fabricating a semiconductor device having a dual metal gate structure according to various aspects of the present disclosure.

Referring to FIG. 1, illustrated is a flowchart of a method 100 for fabricating a semiconductor device having a dual metal gate structure according to various aspects of the present disclosure. Referring also to FIGS. 2A to 2K, illustrated are cross-sectional views of a semiconductor device 200 at various stages of fabrication according to the method 100 of FIG. 1. It is understood that FIGS. 2A to 2K have been simplified to emphasize the formation of a dual metal gate structure of an NMOS device and PMOS device, respectively. Further, it should be noted that part of the semiconductor device 200 may be fabricated with a CMOS process flow. Accordingly, it is understood that additional processes may be provided before, during, and after the method 100 of FIG. 1, and that some other processes may only be briefly described herein. The semiconductor device 200 may be fabricated in a gate last process (also referred to as a replacement poly gate process). In a gate last process, a dummy poly gate structure may be formed first and may be followed normal CMOS process flow until deposition of an interlayer dielectric (ILD). The dummy poly gate structure may then be removed and replaced with a metal gate structure.

Figure 2A:
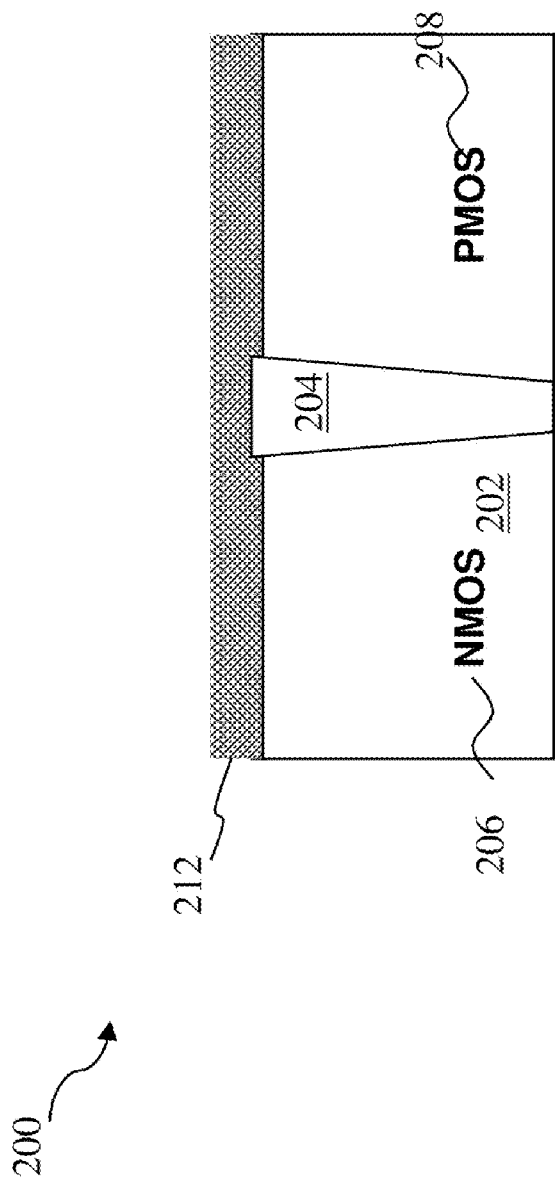
FIGS. 2A to 2K are cross-sectional views of a semiconductor device at various stages of fabrication according to the method of FIG. 1.

The method 100 begins with block 102 in which a semiconductor substrate is provided, the substrate having a first region and a second region. In FIG. 2A, the semiconductor device 200 includes a semiconductor substrate 202 such as a silicon substrate. The substrate 202 may alternatively include silicon germanium, gallium arsenic, or other suitable semiconductor materials. The substrate 202 further includes other features such as various doped regions such as p-wells or n-wells, a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 200 further includes an isolation structure 204 such as a shallow trench isolation (STI) feature formed in the substrate 202 for isolating active regions 206 and 208 in the substrate. The isolation structure 204 may be formed of silicon oxide, silicon nitride, silicon oxynitride, fluoride-doped silicate (FSG), and/or a low k dielectric material known in the art. The active region 206 may be configured as an NMOS device and the active region 208 may be configured as a PMOS device.

The semiconductor device 200 further includes an interfacial layer (shown in FIG. 2F) formed over the substrate 202. The interfacial layer may include a silicon oxide layer (e.g., thermal or chemical oxide formation) having a thickness ranging from about 5 to about 10 angstrom (A). The interfacial layer may be formed by atomic layer deposition (ALD), chemical vapor deposition (CVD), physical vapor deposition (PVD or sputtering), thermal oxidation, or combinations thereof. Alternatively, the interfacial layer may optionally include silicon oxynitride (SiON).

The method 100 continues with block 104 in which a high-k dielectric layer is formed over the substrate. The semiconductor device 200 further includes a high-k dielectric layer 212 formed on the interfacial layer. The high-k dielectric layer 212 may be formed by ALD, CVD, metal-organic CVD (MOCVD), PVD, thermal oxidation, or combinations thereof. The high-k dielectric layer 212 may include a thickness ranging from about 10 to about 30 angstrom (A). The high-k dielectric layer 212 may include hafnium oxide ($HfO_x$). Alternatively, the high-k dielectric layer 212 may optionally include other high-k dielectrics such as LaO, AlO, ZrO, TiO, $Ta_2O_5$, $Y_2O_3$, $SrTiO_3$ (STO), $BaTiO_3$ (BTO), BaZrO, HfZrO, HfZrON, HfLaO, HfSiO, HfSiON, LaSiO, AlSiO, HfTaO, HfTiO, $(Ba,Sr)TiO_3$ (BST), $Al_2O_3$, $Si_3N_4$, oxynitrides, or other suitable materials.

Figure 2B:
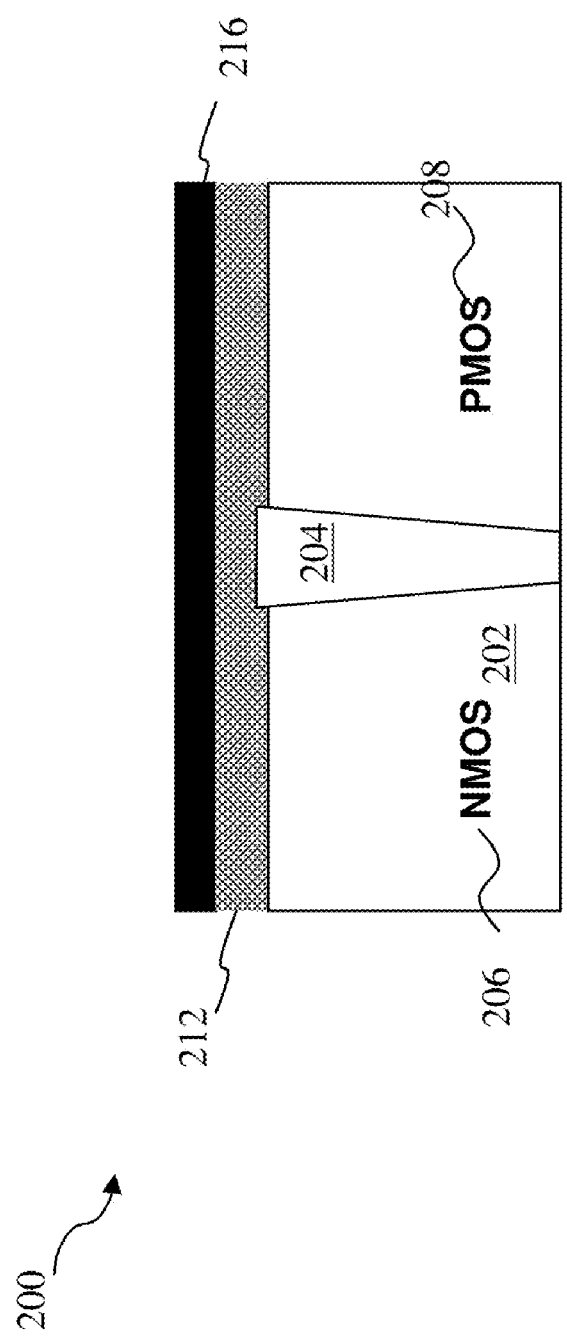

The method 100 continues with block 106 in which a barrier layer is formed over the high-k dielectric layer. In FIG. 2B, the semiconductor device 200 further includes a barrier layer 216 formed over the high-k dielectric layer 212. The barrier layer 216 may include TiN having a thickness ranging from about 10 to about 20 angstrom (A). The barrier layer 216 may have a composition of $Ti(x)N(1-x)$ where x=0.43 to 0.57. The barrier layer 216 may function as a barrier between the high-k dielectric layer 212 and a subsequently formed dummy poly gate structure to reduce or eliminate the risk of Fermi level pinning between the poly and the high-k dielectric 212 during subsequent processing. Further, the barrier layer may also function as a stop layer for a subsequent etching process discussed below. The barrier layer 216 may be formed by various deposition techniques such as physical vapor deposition (PVD or sputtering), CVD, plating, or other suitable technique.

Figure 2C:
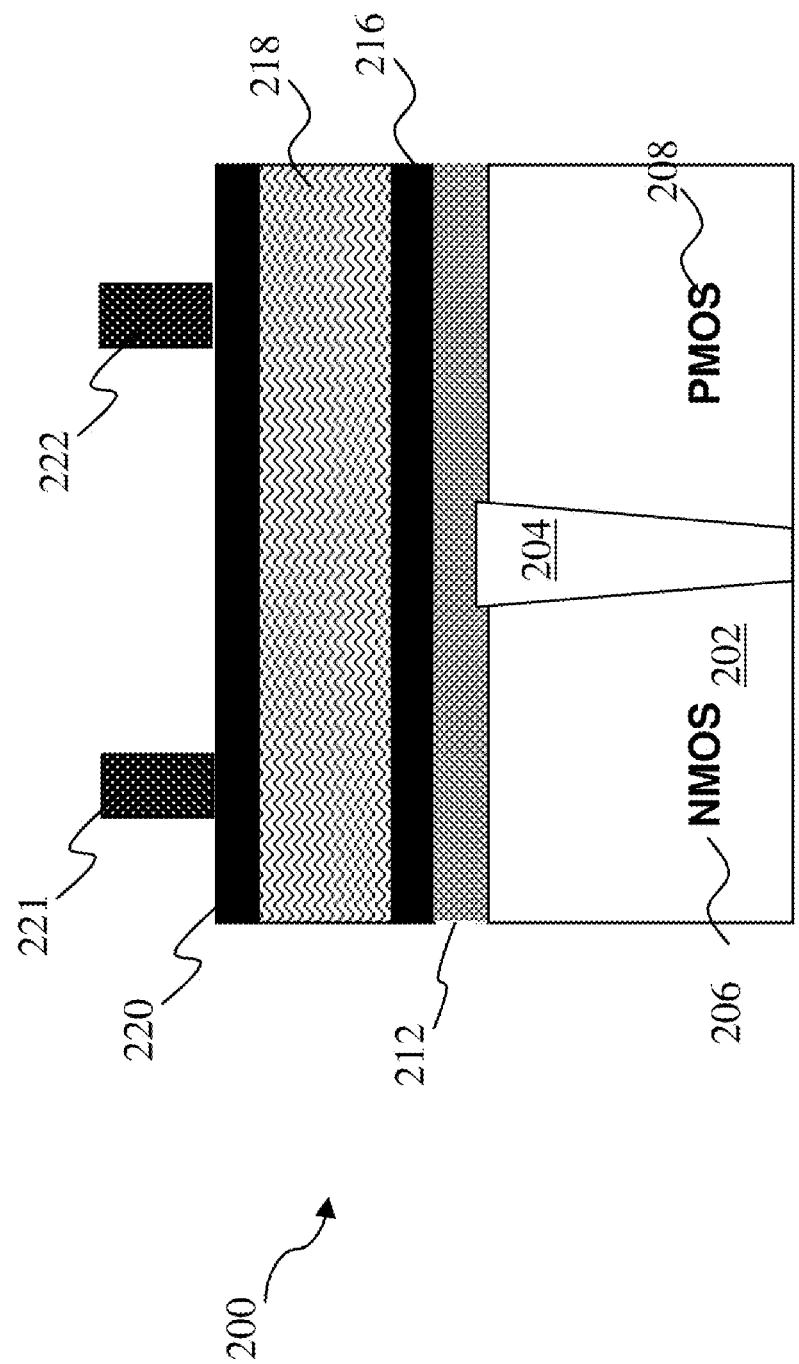

The method 100 continues with block 108 in which a polysilicon layer is formed over the first metal layer. In FIG. 2C, the semiconductor device 200 further includes a polysilicon (or poly) layer 218 formed over the barrier layer 216 by a suitable deposition process. The poly layer 218 may include a thickness ranging from about 400 to about 800 angstrom (A). The semiconductor device 200 may further include a hard mask layer 220 formed on the poly layer 218. The hard mask layer may include silicon nitride, silicon oxynitride, silicon carbide, and/or other suitable dielectric materials, and may be formed using a method such as CVD or PVD. The hard mask layer 220 may include a thickness ranging from about 100 to about 400 angstrom (A). Additionally, the semiconductor device 200 may include an antireflective coating layer or bottom antireflective coating (BARC) layer to enhance a photolithography process for patterning a photoresist layer. For example, a patterned photoresist layer may be formed on the hard mask layer 220 including a pattern 221 overlying the NMOS device 206 and a pattern 222 overlying the PMOS device 208. The patterns 221, 222 may be used to pattern the hard mask layer 220 by a dry etch or wet etch process.

Figure 2D:
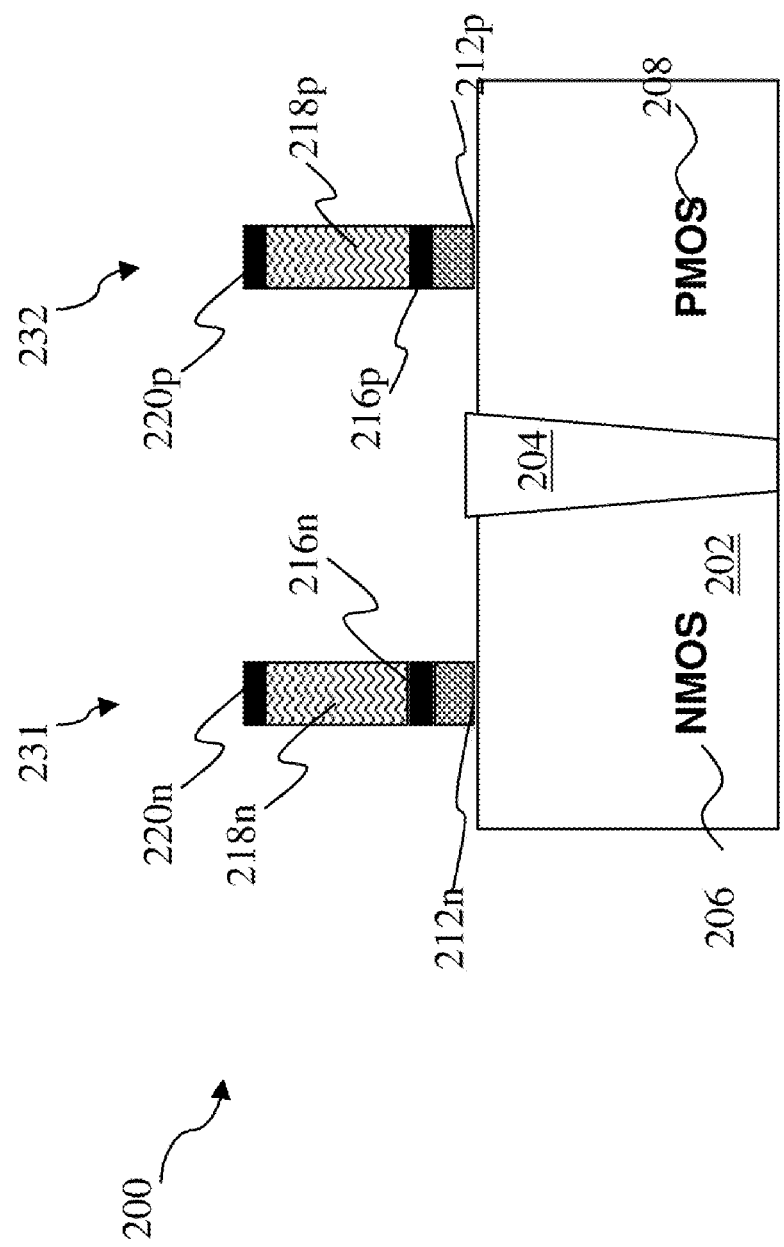

The method 100 continues with block 110 in which a first gate stack is formed in the first region and a second gate stack may be formed in the second region. In FIG. 2D, the patterned hard mask is used to form a gate stack 231 in the NMOS device 206 and a gate stack 232 in the PMOS device 208 by a dry etch, wet etch, or combination dry and wet etch process. For example, the pattern 220n, 220p of the hard mask layer may be transferred to the polysilicon layer 218 to form the dummy poly gate structure 218n, 218p. The gate stack 231 may include a high-k dielectric 212n, a barrier layer 216n, a dummy poly gate 218n, and a hard mask 220n. The gate stack 232 may include an interfacial layer a high-k dielectric 212p, a barrier layer 216p, a dummy poly gate 218p, and a hard mask 220p.

Figure 2E:
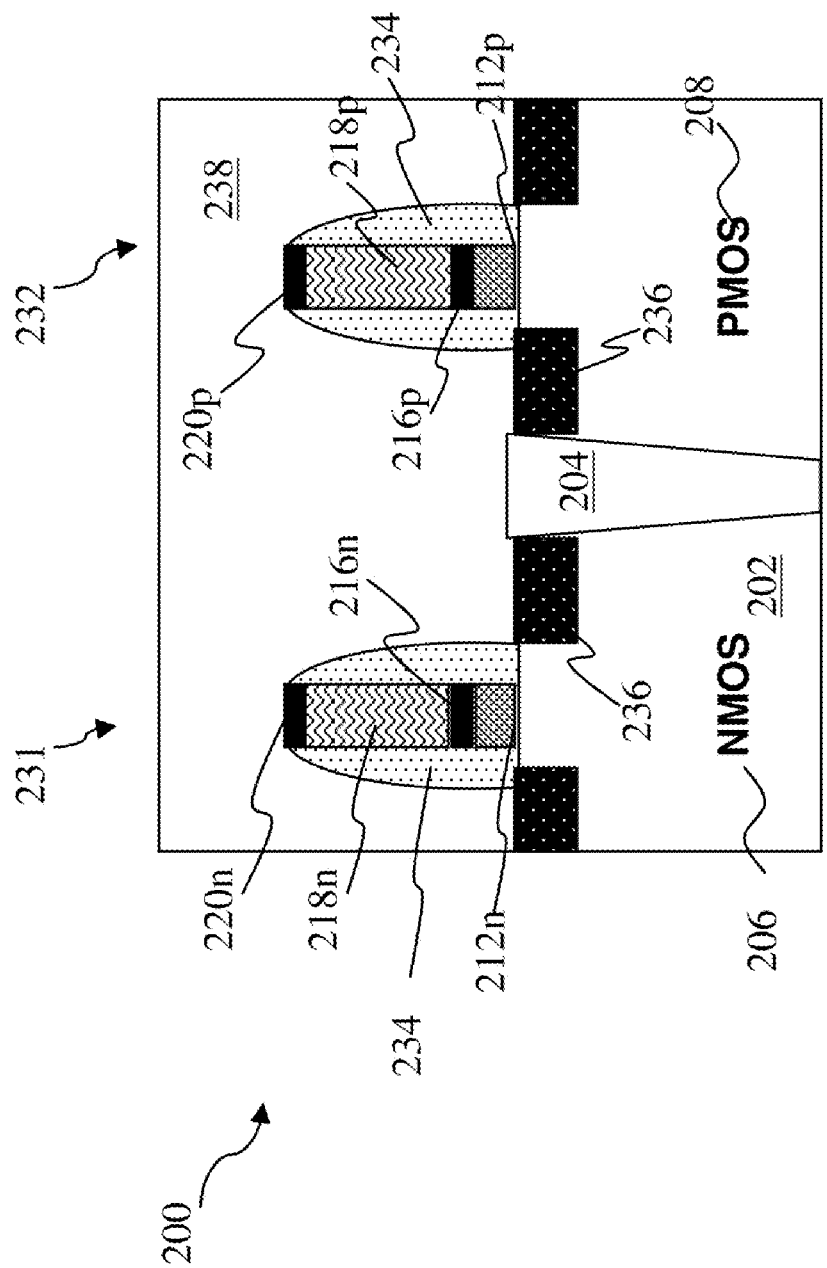

The method 100 continues with block 111 in which sidewall spacers are formed on the sidewalls of the first and second gate stacks. In FIG. 2E, various features and structures may be formed in a CMOS process flow as is known in the art, and thus are not described in detail herein. For example, lightly doped source/drain regions (LDD), sidewall or gate spacers 234, heavy doped source/drain (S/D) regions 236, silicide features, contact etch stop layer (CESL), and an interlayer dielectric (ILD) layer 238 may be formed. The spacers 234 may be formed of silicon oxide, silicon nitride, silicon oxynitride, silicon carbide, or other suitable materials. The LDD and S/D regions 236 may be formed by implanting p-type or n-type dopants into the substrate 202 depending on the desired transistor configuration (e.g., NMOS or PMOS). The silicide features may be formed on the S/D regions 236 by a self-aligned silicide process. The CESL may be formed of silicon nitride, silicon oxynitride, or other suitable materials. The CESL composition may be selected based upon selectively to one or more additional features of the semiconductor device 200. The ILD layer 238 formed over the CESL by CVD, high density plasma (HDP), PVD, spin-on, or other suitable methods. The ILD layer 238 may include silicon oxide, silicon oxynitride, or a low-k material.

Figure 2F:
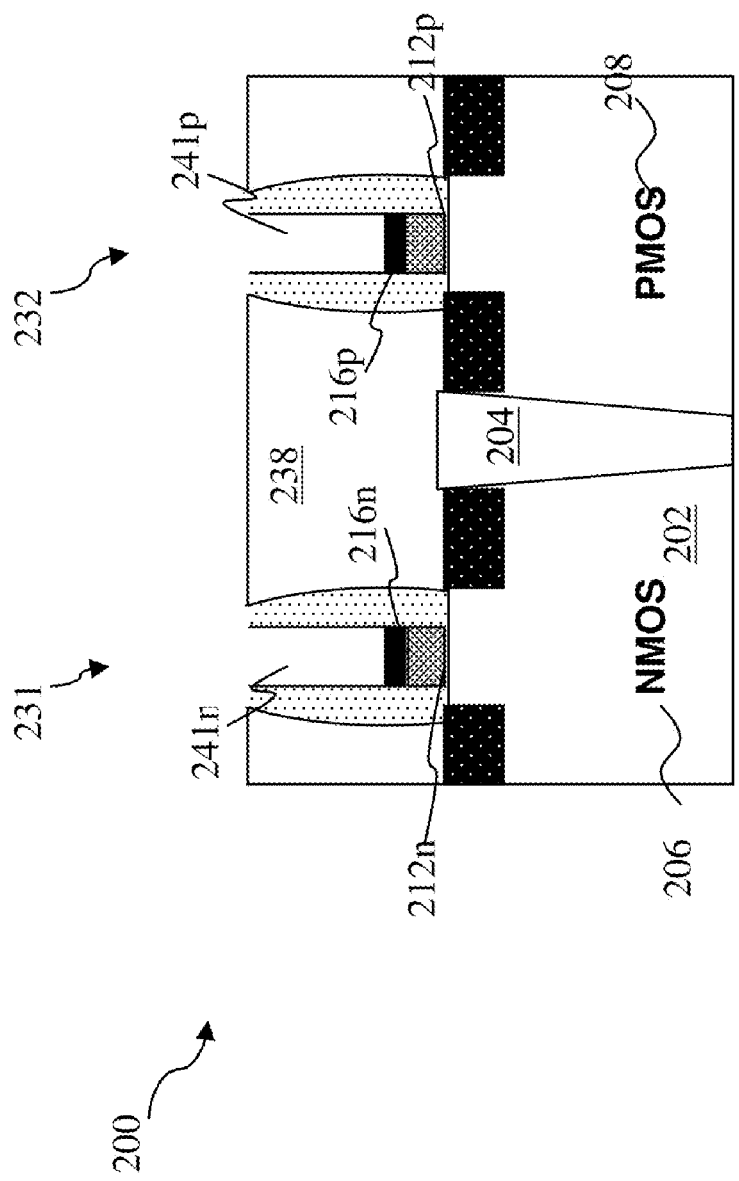

The method 100 continues with block 112 in which the dummy poly gate is removed from the first gate stack and the second gate stack thereby forming a first trench and a second trench, respectively. In FIG. 2F, a chemical mechanical polishing (CMP) process is performed to expose a top portion of the dummy poly gates 218n, 218p of the gate stacks 231, 232, respectively. The CMP process may planarize the ILD layer 238 to reach the hard mask layers 220n, 220p, and may continue with an overpolishing to remove the hard mask layers and expose the dummy poly gates 218n, 218p. The dummy poly gate 218n in the NMOS device 206 and dummy poly gate 218p in the PMOS device 208 may be removed by an etch back process, dry etch, wet etch, or other suitable process. For example, a wet etch process may include exposure to a hydroxide containing solution (e.g., ammonium hydroxide), deionized water, and/or other suitable etchant solutions. The barrier layer 216n, 216p may function as an etch barrier for the etching. The dummy poly gates 218n, 218p may be selectively etched thereby forming a trench 241n in the gate stack 231 and a trench 241p in the gate stack 232.

The method 100 continues with block 114 in which a first metal layer is formed over the barrier layer in the second trench. One or more metal layers (e.g., work function metal layers) are formed in the trench 241p in the PMOS device 208. For example, a P-type work function metal (P-metal) may be formed in the trench 241p of the PMOS device 208. It is understood that FIGS. 2G to 2K illustrate a more detailed cross-sectional view of the metal gates of the NMOS device 206 and PMOS device 208, respectively, the metal gates being formed in a gate last process. In FIG. 2F, a layer of TiN 244 may be deposited to partially fill in the trenches 241n, 241p and may have a thickness of about 40 angstrom (A). The TiN layer 244 may be formed by atomic layer deposition (ALD) or other suitable process. A layer of WN 246 may be deposited over the TiN layer 244 to partially fill in the trenches 241n, 241p and may have a thickness of about 50 angstrom (A). The WN layer 246 may be formed by PVD or other suitable process. Although a multilayer P-metal is illustrated it is understood that the P-metal may comprise a single metal layer such as TiN, WN, or other suitable metal.

Figure 2G:
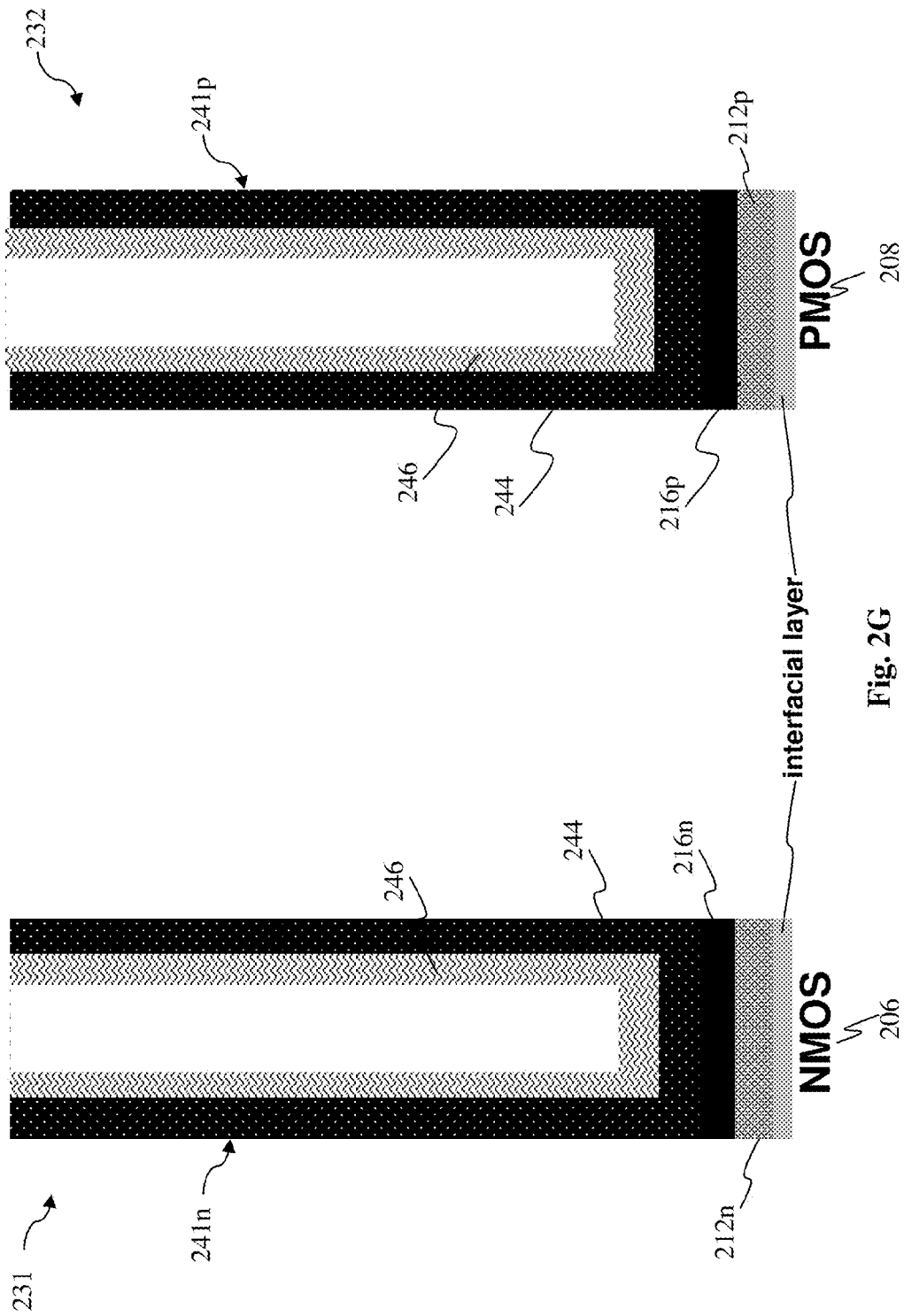

In FIG. 2G, the TiN 244 and WN layers 246 are removed from the trench 241n in the NMOS device 206 by a N/P patterning process. For example, the N/P patterning process may be performed to protect the PMOS device 208 with a photoresist. The photolithography process may include spin coating, soft-baking, exposure, post-baking, developing, rinsing, drying, and other suitable process. Alternatively, the N/P patterning may be performed by immersion lithography, electron beam lithography, or other suitable process. Accordingly, the TiN 244 and WN layers 246 in the NMOS device 206 may be removed by a dry etch or wet etch process. Thus, the TiN 244p and WN 246p layers (e.g., P work function metal) remain in the trench 241p in the PMOS device 208.

Figure 2H:
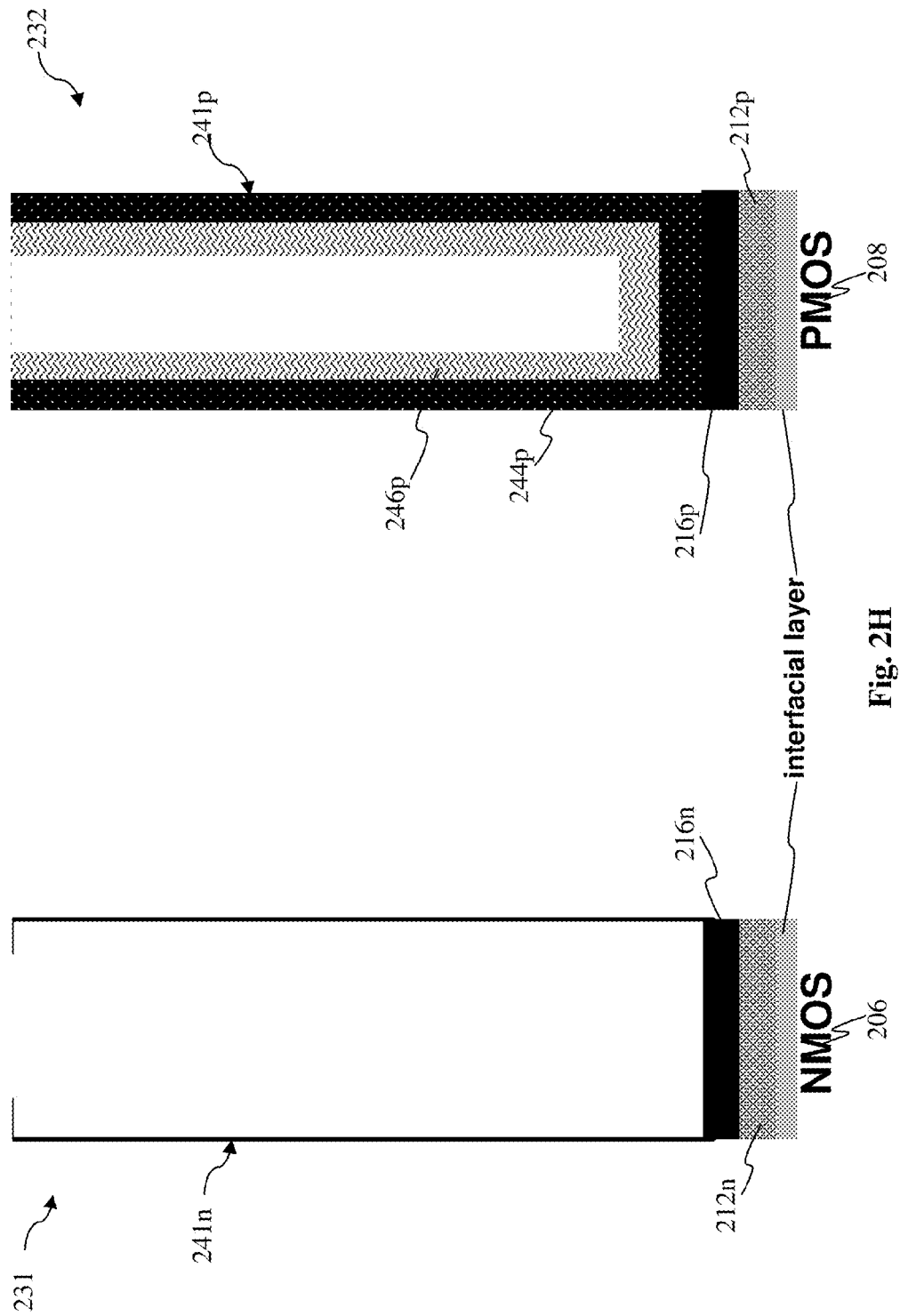

The method 100 continues with block 116 in which a second metal layer is formed over the barrier layer in the first trench and over the first metal layer in the second trench. In FIG. 2H, a layer of Ti 248 is deposited such that the Ti layer 248 is formed over the barrier layer 216n in the trench 241n and formed over the TiN/WN layers 244p, 246p in the trench 241p. The Ti layer 248 may have a thickness of about 30 angstrom (A). The Ti layer 248 may be deposited by PVD using, for example, an Extensa™ System (Applied Materials, Inc of Santa, Clara, Calif.).

The method 100 continues with block 118 in which a third metal layer is formed over the second metal layer in the first and second trenches. In the present embodiment, a layer of Al 250 is deposited such that the Al layer 250 is formed over the Ti layer 248 in the trenches 241n, 241p. The Al layer 250 may have a thickness of about 70 angstrom (A). The Al layer 250 may be formed by CVD or other suitable process.

Figure 2I:
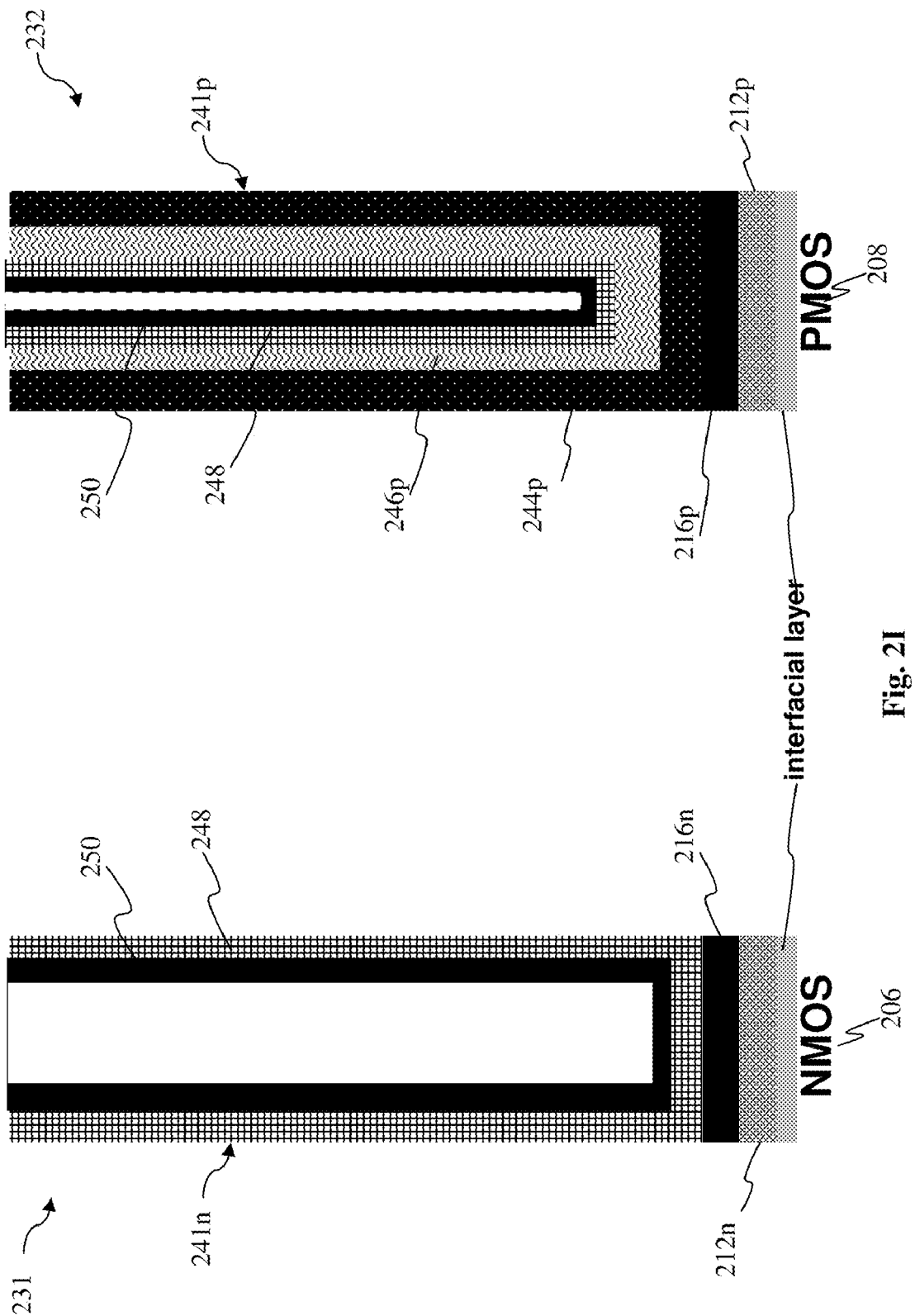

The method 100 continues with block 120 in which a thermal process is performed to reflow the second metal layer and the third metal layer. In FIG. 2I, the thermal process 251 is performed to reflow the Al layer 250 and the Ti layer 248 (e.g., for Al/Ti reaction) in the trenches 241n, 241p. The thermal process 251 may be performed at a temperature ranging from 200 to about 500 degree C. Also, the thermal process 251 may be performed for a time period ranging from 50 to about 200 seconds. The metal composition in the NMOS device 206 may include a ratio of Ti:Al=2.3:1. Additionally, it is understood that the metal composition of Ti/Al may include other ratios. Accordingly, the reflow process provides for tuning an effective work function of the metal gates in the NMOS device 206 and PMOS device 208.

Figure 2J:
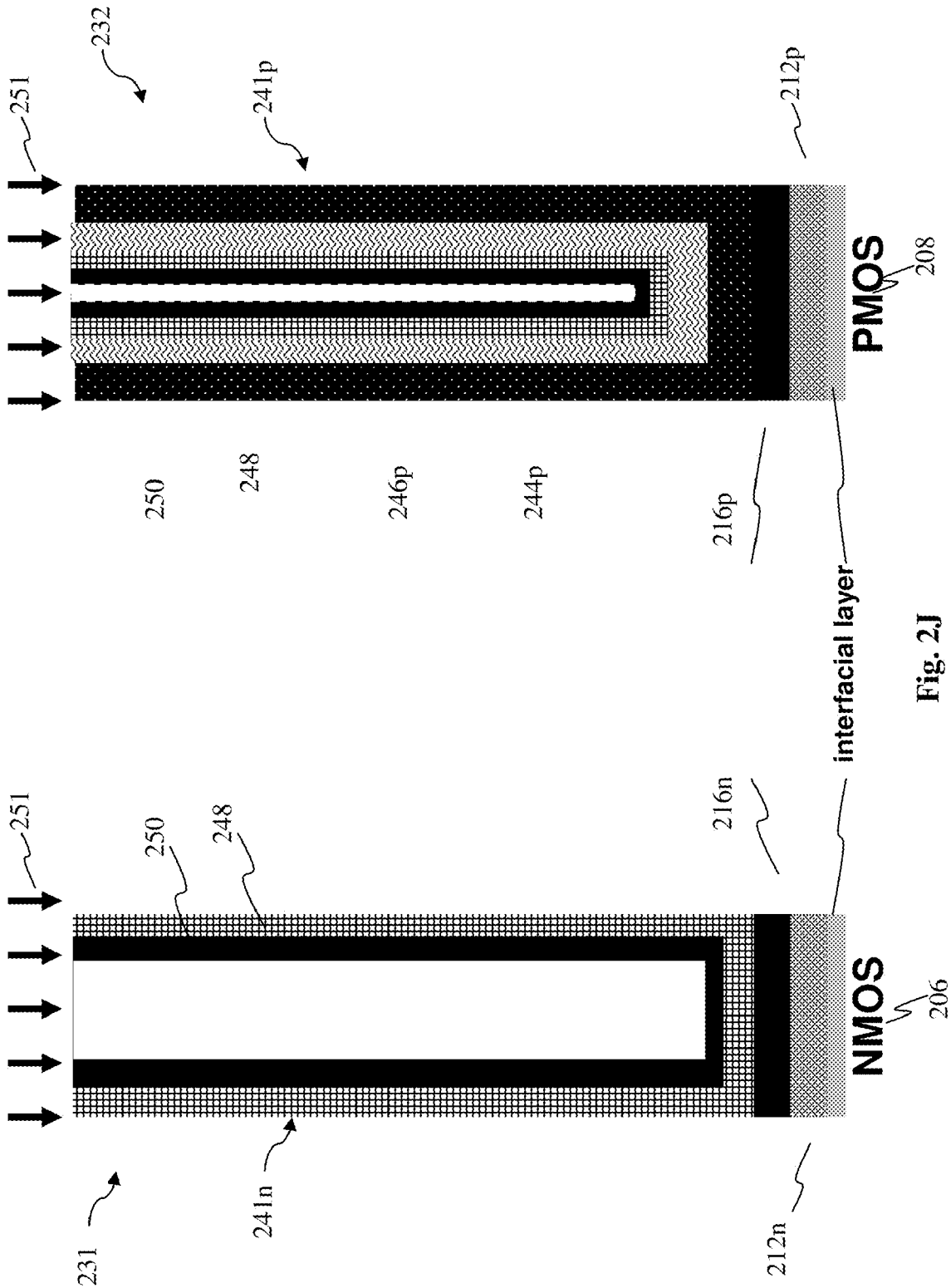
Figure 2K:
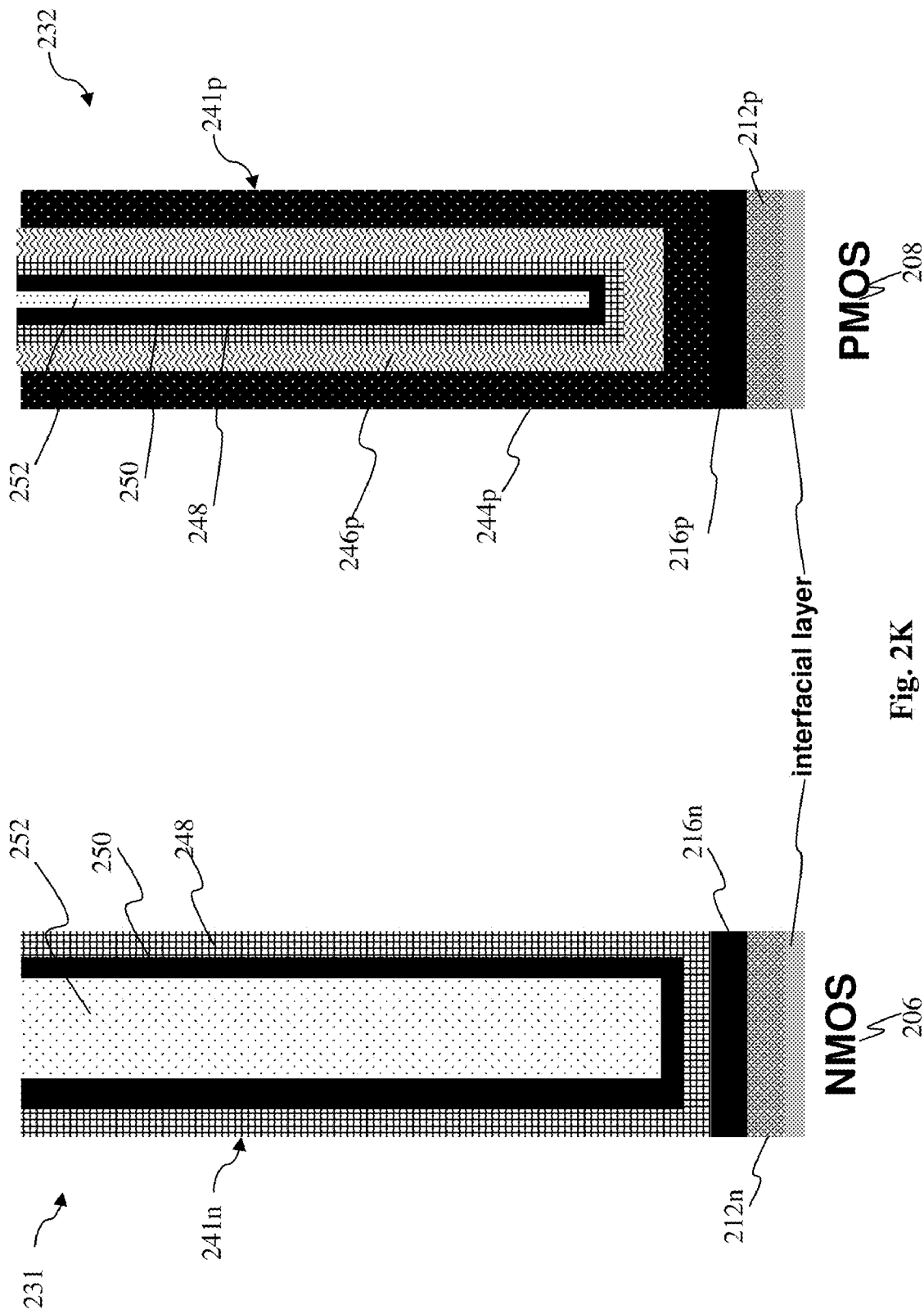

The method 100 continues with block 122 in which a fourth metal layer is deposited to fill in the remainder of the first and second trenches. In FIG. 2J, a fill metal layer 252, such as Al, is formed over the reflowed Ti/Al layer 248, 250 in the trenches 241n, 241p by bottom-up PVD, or other suitable method. Alternatively, the fill metal layer 252 may optionally include W, Cu, or other suitable materials. The fill metal layer 252 may be deposited until the remainder of the trenches 241n, 241p are substantially or completely filled. The amount of the fill metal layer 252 in the trench 241n (NMOS device 206) is greater than the amount of fill metal layer 252 in the trench 241p (PMOS device 208). Thus, it should be noted that the PMOS gap fill may be challenging due to the various metal layers already deposited in the trench 241p. Accordingly, an additionally CMP process may be performed to planarize and remove the various metal layers from outside the trench prior to depositing the subsequent fill metal layer or other metal layers.

The method 100 continues with block 124 in which a CMP process is performed. A CMP (e.g., metal gate CMP process) is performed on the various metal layers to planarize the gate structures 231, 232 in the NMOS device 206 and PMOS device 208. The CMP process may have a high selectivity to provide a substantially planar surface for the gate structures and ILD layer. The gate structure 231 of the NMOS device 206 may include the interfacial layer, the high-k dielectric 212n, the TiN layer 216n, the reflowed Ti/Al layer 248, 250, and the Al layer 252. The gate structure 232 of the PMOS device 208 may include the interfacial layer, the high-k dielectric 212p, the TiN layer 216p, the TiN layer 244p, the WN layer 246p, the reflowed Ti/Al layer 248, 250, and the Al layer 252. Accordingly, the metal gate of the NMOS device 206 may perform the proper N work function and the metal gate of the PMOS device 208 may perform the proper P work function. Thus, the desired threshold voltages of the NMOS device 206 and PMOS device 208, respectively, may be easily achieved to improve device performance and reliability.

It is understood that the semiconductor device 200 may undergo further processing to form various features such as contacts/vias, interconnect metal layers, interlayer or metal dielectric, passivation layers, bonding pads, packaging, etc.

The present invention achieves different advantages in various embodiments disclosed herein. It is understood that different embodiments offer different advantages, and that no particular advantage is necessarily required for all embodiments. For example, the present disclosed method provides a simple and cost-effective method for tuning a work function of the metal gates of NMOS and PMOS devices in a CMOS process flow. The methods and devices disclosed herein do not require a capping layer for tuning the work function of the metal gates, and thus carrier mobility is not adversely effected. Also, the methods and devices disclosed herein may easily be integrated with current CMOS process flow and semiconductor processing equipment. For example, the methods disclosed herein implement materials and processes that are friendly and compatible with the CMOS process flow, and that are inexpensive to incorporate with the process flow.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the specified thickness of the various metal layers may be adjusted to optimize the performance characteristics of the NMOS and PMOS devices for a particular technology node and application.

What is claimed is:

1. A method of fabricating a semiconductor device comprising:
    providing a semiconductor substrate;
    forming a first trench and a second trench;
    providing a first metal layer in the first and second trenches;
    removing the first metal layer, at least partially, from within the first trench but not the second trench;
    providing a second metal layer in the first and second trenches;
    providing a third metal layer in the first and second trenches; and
    performing a thermal process to reflow the second metal layer and the third metal layer.

2. The method of claim 1, further comprising:
    forming a fourth metal layer to fill a remainder of the first and second trenches.

3. The method of claim 1, wherein the second metal layer includes Ti.

4. The method of claim 3, wherein the third metal layer includes Al.

5. The method of claim 4, wherein performing the thermal process includes performing the thermal process at a temperature ranging from 200 to about 500 degree C.

6. The method of claim 2, further comprising performing a chemical mechanical polishing (CMP) after forming the fourth metal layer to planarize the first and second gate structures.

7. The method of claim 6, further comprising performing another CMP process prior to forming the fourth metal layer.

8. The method of claim 1, wherein the first metal layer includes TiN and the fourth metal layer includes Al.

9. The method of claim 8, wherein the first metal layer includes a multi-metal layer of TiN and WN.

10. The method of claim 2, wherein the fourth metal layer is formed after the thermal process.

11. A method of fabricating a semiconductor device comprising:
    providing a semiconductor substrate;
    forming first and second trenches;
    forming a P-type work function metal (P-metal) to partially fill in the first and second trenches;
    removing the P-metal, at least partially, from within the first trench;
    providing a layer of Ti in the first and second trenches;
    providing a layer of Al in the first and second trenches; and
    reflowing the Al layer and Ti layer to form a layer of TiAl.

12. The method of claim 11, further comprising:
    forming a first transistor and a second transistor in the substrate, the first transistor including a first gate structure, the second transistor including a second gate structure, the first gate structure and the second gate structure each including a high-k dielectric layer formed over the substrate, a barrier layer formed over the high-k dielectric layer, and a dummy poly layer formed over the barrier layer; and
    removing the dummy poly layer from the first and second gate structures to thereby form the first and second trenches, respectively.

13. The method of claim 11, further comprising:
    forming a fill metal layer to fill in the remainder of the first and second trenches.

14. The method of claim 11, wherein the Al layer is formed by chemical vapor deposition (CVD) and the Ti layer is formed by physical vapor deposition (PVD).

15. The method of claim 14, wherein reflowing the Al layer and Ti layer includes performing a thermal process at a temperature ranging from about 200 to about 500 degree C. and wherein the Ti layer includes a thickness of about 30 angstrom and the Al layer includes a thickness of about 70 angstrom.

16. A method of fabricating a semiconductor device comprising:
    forming first and second trenches in a semiconductor substrate;
    forming a P-type work function metal (P-metal) to partially fill the first and second trenches;
    removing the P-metal, at least partially, from within the first trench but not the second trench;
    forming a layer of TiAl inside the trench; and
    performing a chemical mechanical polishing (CMP) to at least partially planarize the layer of TiAl.

17. The method of claim 16, further comprising
    forming a fill metal layer to fill a remainder of the first and second trenches;
    performing another CMP immediately after forming the fill metal layer to remove the fill metal layer disposed outside the first and second trenches.

18. The method of claim 17, wherein the fill metal layer includes one of Al, W, and Cu.

19. The method of claim 16, wherein the Ti layer includes a thickness of about 30 angstrom, and wherein the Al layer includes a thickness of about 70 angstrom.

20. The method of claim 19, wherein the TI layer is formed by physical vapor deposition (PVD), and wherein the Al layer is formed by chemical vapor deposition (CVD).

* * * * *